United States Patent
Tang et al.

(10) Patent No.: US 11,282,722 B2
(45) Date of Patent: Mar. 22, 2022

(54) CHIP FRONT SURFACE TOUCHLESS PICK AND PLACE TOOL OR FLIP CHIP BONDER

(71) Applicants: Yunjun Tang, Danville, CA (US); Zongrong Liu, Pleasanton, CA (US); Ge Yi, San Ramon, CA (US)

(72) Inventors: Yunjun Tang, Danville, CA (US); Zongrong Liu, Pleasanton, CA (US); Ge Yi, San Ramon, CA (US)

(*) Notice: Subject to any disclaimer, the term of this patent is extended or adjusted under 35 U.S.C. 154(b) by 129 days.

(21) Appl. No.: 16/550,109

(22) Filed: Aug. 23, 2019

(65) Prior Publication Data
US 2021/0057242 A1    Feb. 25, 2021

(51) Int. Cl.
H01L 21/67    (2006.01)
H01L 23/00    (2006.01)
H01L 21/683   (2006.01)

(52) U.S. Cl.
CPC .... *H01L 21/67144* (2013.01); *H01L 21/6836* (2013.01); *H01L 24/75* (2013.01); *H01L 2221/68381* (2013.01); *H01L 2224/75651* (2013.01)

(58) Field of Classification Search
CPC ........... H01L 21/67144; H01L 21/6836; H01L 2221/68322; H01L 2221/68354; H01L 2221/68381; H01L 2224/75651; H01L 24/75
See application file for complete search history.

(56) References Cited

U.S. PATENT DOCUMENTS

| | | | |
|---|---|---|---|
| 3,473,212 A * | 10/1969 | Beck ................ | H01L 21/67144 29/705 |
| 5,979,739 A * | 11/1999 | Jin .................... | H01L 21/67144 228/6.2 |
| 6,588,098 B1 * | 7/2003 | Lim .................. | H01L 21/56 257/E21.502 |
| 8,142,611 B2 * | 3/2012 | Shibata ............ | H01L 21/67132 156/716 |
| 8,272,120 B2 * | 9/2012 | Gruber ............. | H01L 24/32 29/729 |
| 9,570,417 B2 * | 2/2017 | Jeong ............... | H01L 24/75 |
| 10,658,327 B1 * | 5/2020 | Wang ............... | H01L 21/67144 |
| 2005/0274457 A1 * | 12/2005 | Cheung ............ | H01L 21/67132 156/765 |
| 2021/0057242 A1 * | 2/2021 | Tang ................ | H01L 21/6836 |

* cited by examiner

*Primary Examiner* — Minh N Trinh

(57) ABSTRACT

A piece of pick and place tool or a chip bonding equipment, which has innovative designs enabling chip(s) on a tape to get picked up without touching its front surface, is invented. The designs use levitation technologies to receive and hold the chips detached from the tape from a face-down position. A streamline design is also invented to provide better productivity. The invented pick and place tool or chip bonder is particularly useful for applications which require using chips with zero tolerance of particle and/or contamination on the chip front surfaces.

19 Claims, 6 Drawing Sheets

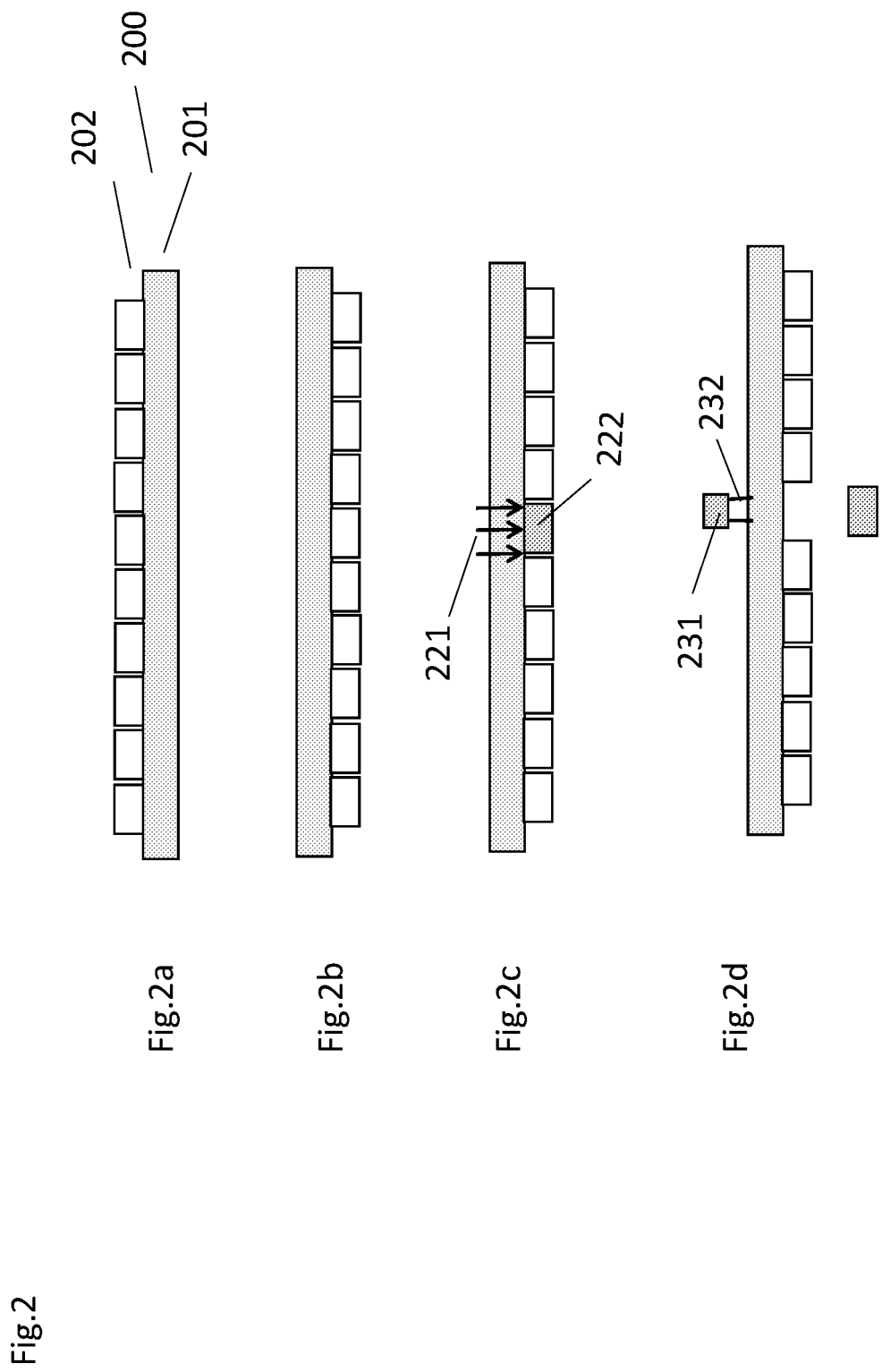

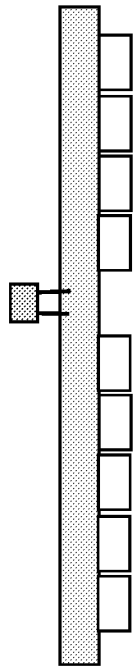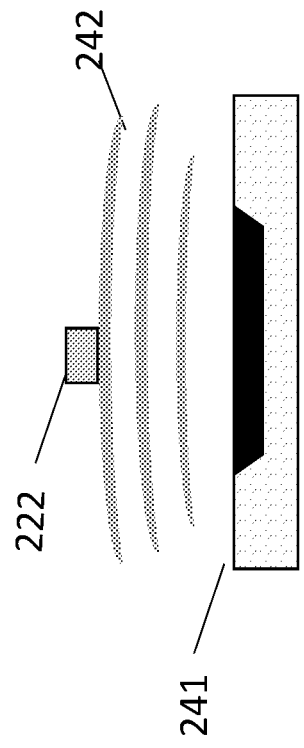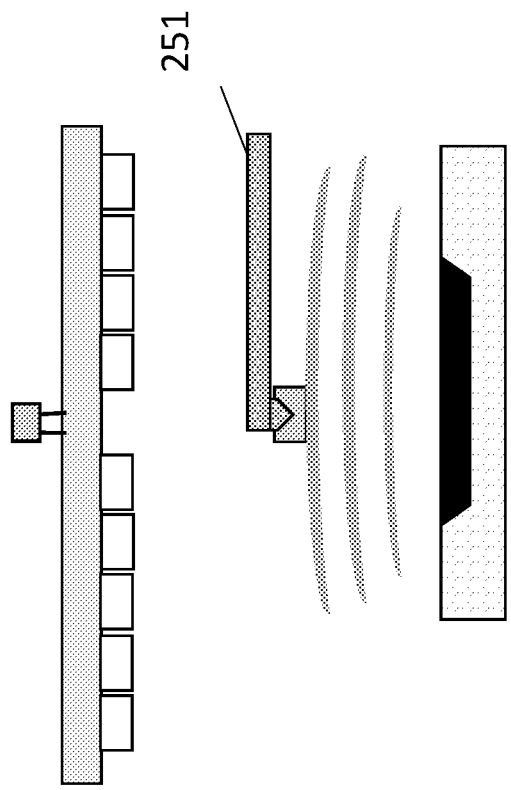
Fig.2 con't
Fig.2e
Fig2f

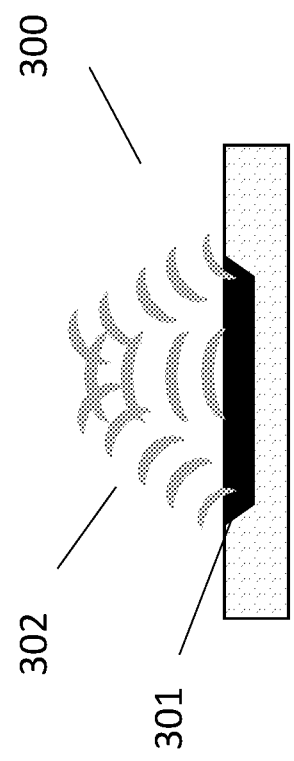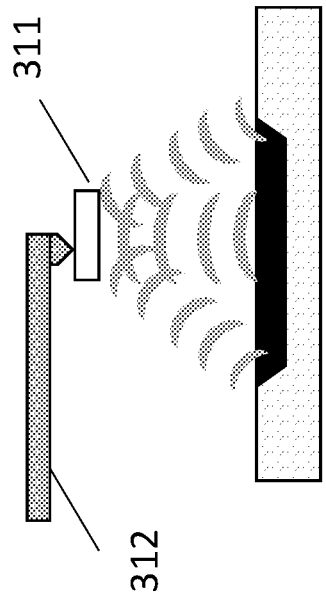
Fig.3
Fig.3a
Fig.3b

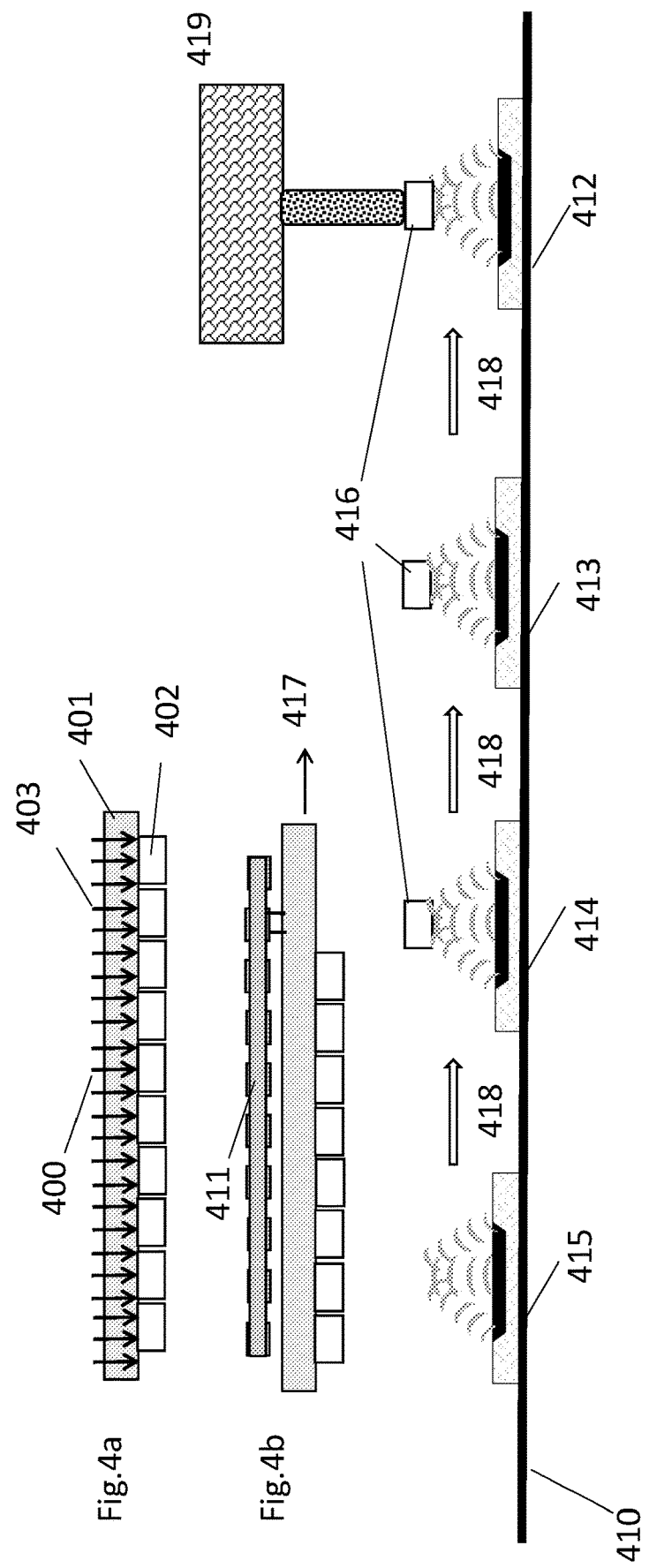

CHIP FRONT SURFACE TOUCHLESS PICK AND PLACE TOOL OR FLIP CHIP BONDER

FIELD OF INVENTION

The invention is related to a pick and place tool or a flip chip bonder.

Particularly, this tool is for applications such as direct bonding and hybrid bonding, which request the front surfaces of the incoming chips with zero chemical and/or particle contamination.

BACKGROUND ART

Since the greatly slow down of the Moore's law in the last few years due to its high cost and complications, more than Moore's path becomes an alternative, even a cheap solution to further exploit the chip technology. In terms of technology approach, heterogeneous integration (HI) is the most relevant choice to represent the more than Moore's path.

From process side, there are three bonding approaches to facilitate heterogeneous integration, namely wafer-to-wafer, chip-to-wafer, and chip-to-chip. The first two approaches are much more cost-efficient. However, if the wafers providing chips have different chip sizes, or one kind of wafers with much lower chip yield, then the chip-to-wafer approach makes the only economic senses.

Unlike chip-to-wafer approach via eutectic bonding or adhesive bonding, some bonding technologies such as direct bonding and hybrid bonding using hard dielectric materials as the bonding interfaces require bonding surface roughness normally below one nanometer. In other words, there is zero tolerance to the bonding surface contamination caused by dicing, chip cleaning and handling, and bonding.

Currently there is no dedicated chip bonding or pick and place equipment to resolve this chip front surface contamination issue. Here, we propose a novel design for a pick and place tool or a bonder to enable chip-to-chip and chip-to-wafer placement or bonding, in which no chip front surface touchness is needed.

SUMMARY OF THE INVENTION

In this invention, a dedicated chip bonding tool or pick and place tool is proposed with some novel approaches to avoid chip front surface contamination after wafer dicing and chip cleaning. The key idea is to avoid any physical contact to the chip front side through novel designs of chip picking and handling solutions using various invented technologies based on various physics principles.

In our invented new equipment, the hardware is separated into three portions: the $1^{st}$ part is a chip supply station; the $2^{nd}$ part is a chip levitation station; and the $3^{rd}$ part is a placement or bonding station. Alternative design is also proposed to increase the tool productivity by introducing streamline tool design with multiple chip receiving heads.

The concept of the invention is to only allow the chip handling tools and mechanism to touch the bottom surfaces of the chips, therefore limit chip front surface contamination. The core of the technology solution is to use one of levitation solutions to receive the chip from a tape, either one by one, or multiple chips at the same time. Our proposed chip pick and place tool or bonder provides a great equipment solution for bonding applications which require chip front surfaces particles/contamination free such as direct bonding and hybrid bonding.

BRIEF DESCRIPTION OF THE DRAWINGS

FIG. 2 an embodiment of chip detachment and chip receiving heads using levitation mechanism.

FIG. 4 embodiment of a steamline design for a proposed chip pick and placement tool or bonder to increase the productivity.

DETAILED DESCRIPTION

The following numerous specific detail descriptions are set forth to provide a thorough understanding of various embodiments of the present disclosure. It will be apparent to one skilled in the art, however, these specific details need not be employed to practice various embodiments of the present disclosure. In other instances, well known components or methods have not been described.

Figure 1:
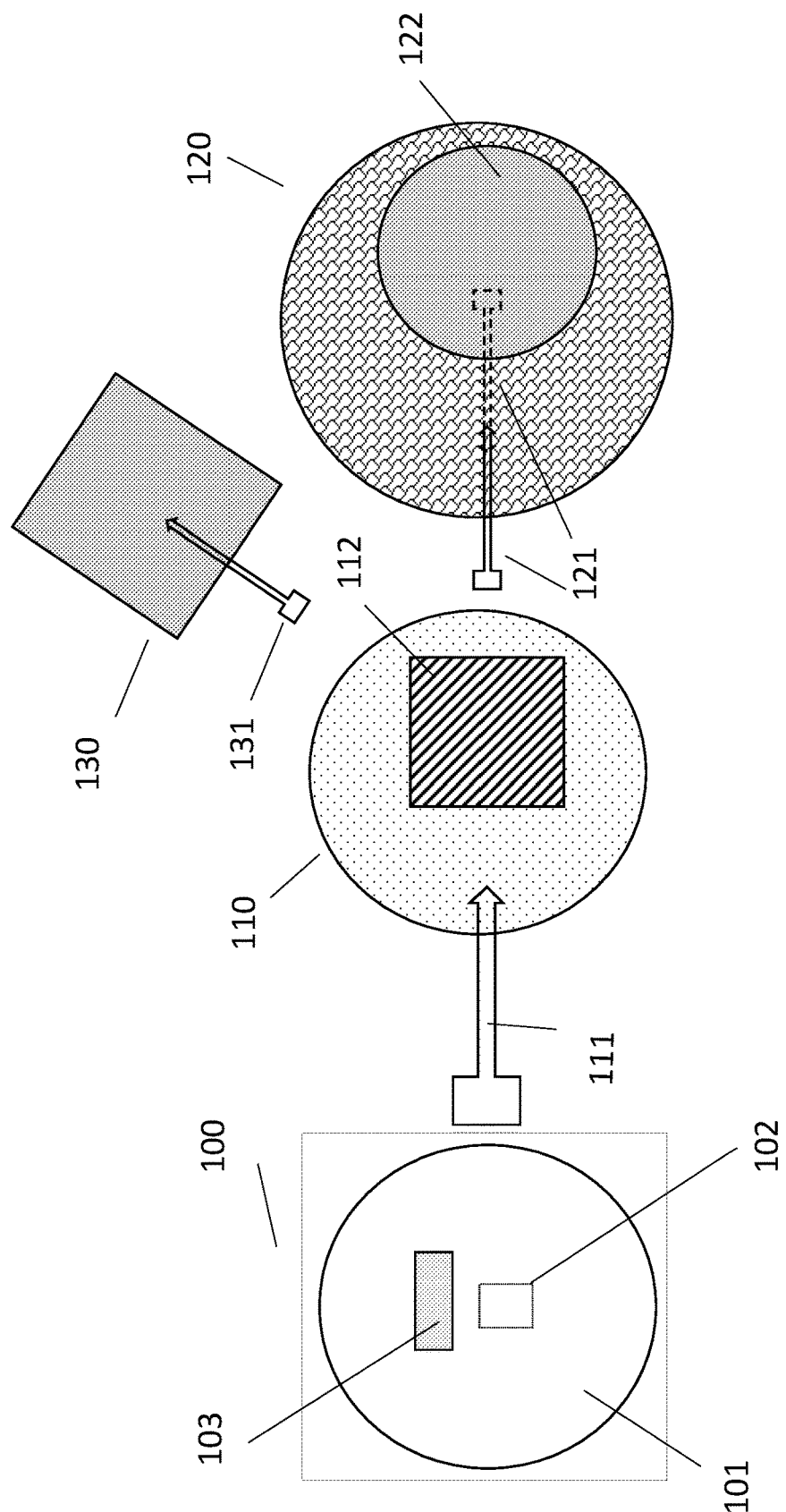
FIG. 1 one of the embodiments of proposed chip pick and placement tool or bonder for chip-to-wafer or chip-to-chip placement or bonding.

FIG. 1 is an embodiment of the station configuration for the proposed chip pick and place tool or bonder. It includes chip supply station 100, chip sitting levitation station 110, chip placement or bonding station 120 and also an optional surface activation station 130. One common design feature for our proposed chip pick and place tool or chip bonder is that the chip front surface will not be touched at all through every process and handling step in the tool to minimize the surface contamination. The chip supplier station 100 supplies chips for the whole tool and has a chip supply stand 101 for holding chips on a tape upside down, together with at least a chip receiving head 102, whose details will be given in FIG. 2 in the following sections. The chip supply station 100 also has a mechanism to detach chip or die 103. The detached die by the mechanism 103 will be received by the receiving head 102. The chip sitting levitation station 110 has a chip pickup arm/tool 111, which pickups the chips from chip receiving head 102 in the chip supply station 100, then put on the chip levitation stand 112. We proposed a dedicated chip sitting levitation station 110 so that we can have a fixed location for the proposed chip receiving head 102 and simplify the mechanical design for the chip supply station 100. The chip placement or bonding station 120 has a a chip handling head 121, either a chip placement head or a chip bonding head, which pickups chips from the chip levitation stand 112 then places or bonds on a wafer or a chip on the substrate stand 122. In the proposed chip pick and place tool or chip bonder, there is also an optional station 130 for bonding surface activation. The pickup tool 131, can pick a chip from chip sitting levitation stand 112 for chip surface activation and then returns the chip to 112. The chip sitting levitation station 110 is optional. When the proposed tool does not have chip sitting levitation station 110, the chip handling head 121 can pickup the chips directly from the chip receiving head 102. If so, then the system only has station 100 and station 120 with the optional station 130 depending on the details of the bonding process steps.

FIG. 2 shows an embodiment of chip detachment, similar to the 103 shown in FIG. 1, using pin pushing and pickup mechanism using chip receiving head with a chip levitation mechanism in the chip supply station 100 of FIG. 1. As shown in FIG. 2a, the incoming chip system 200, has a set of chips 202 sitting on a piece of tape 201 with all the necessary post dicing front surface treatment to ensure there is no front surface particles and contamination. The incoming chip system is loaded into the chip supply stand (seen in FIG. 1 as 101) upside down as shown in FIG. 2b.

FIG. 2c, FIG. 2d, and FIG. 2e show the the process to fish the known good die/chip 222 and the equipment setup to facilitate the process, which also provides the equipment design concept for our proposed equipment invention.

As shown in FIG. 2c, a local UV radiation 221 is shined behind the designated known good die/chip 222 to reduce the adhesive strength so that the chip 222 can be pushed out mechanically, one of mechanisms to detach chip or die shown as 103 in FIG. 1, with the pushing tool 231 with pins 232 as shown in FIG. 2d to allow the die 22 detached from the the piece of tape 201. Depending on the tape used and its adhesive strength, it may not need a local UV source but a cross whole wafer UV illumination while a UV sensitive tape other than a pressure sensitive tape is used as long as the chips do not drop under its gravity during the chip fishing process.

Below the chip supply stand (shown as 101 in FIG. 1), there is a chip receiving head shown here as 241 (shown as 102 in FIG. 1). The chip receiving head 241 has a mechanism to provide levitation for the chip 222 pushed out and dropping under the influence of its gravity. The levitation mechanism and hardware can be either sonic levitation with a ultrasonic generator array; or sonic levitation based on MEMS speaker array; or aerodynamic levitation with gas outlets array with air pressure control; or even electrostatic levitation with electronic charged plates. For the simplicity, in FIG. 2d we show a case of sonic-levitation-based design for the chip receiving head. In details, the chip receiving head 241 is an acoustic wave generator, which produces a set of mechanical waves (if needed, together with its wave reflection from the chips and tape) to form a standing wave 242. The standing wave 242 can support the chip 222 against its gravity and enable it floating. The chip 222 is then picked by a pickup tool 251, which can be the chip pickup arm/tool 111 from station 110 or the chip handling head of 121 from the chip placement or bonding station 120 as shown in FIG. 1 depending on the tool configurations.

The incoming chip system 200 can be a full diced wafer on a dicing tape or just chips on a piece of tape as shown above.

Figure 3C:
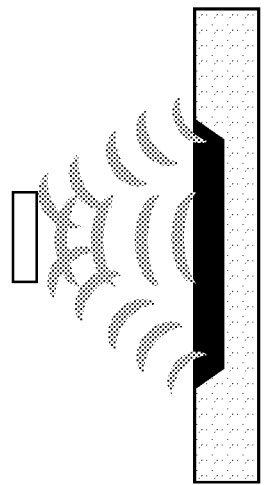
FIG. 3 one of the embodiments of chip sitting levitation stand by acoustic levitation.
Figure 3D:
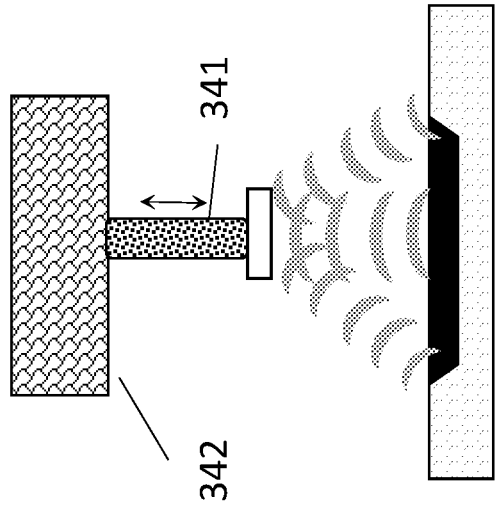

FIG. 3 shows an embodiment of chip sitting levitation stand 300 (shown as 112 in station 110 of FIG. 1) based on acoustic levitation system. In details, as shown in FIG. 3a an acoustic standing wave is produced from the interference between the acoustic waves 302 from a set of ultrasonic generator array in the acoustic wave generator 301. The standing wave provides a supporting force to balance the gravity of a chip to enable its levitation. As shown in FIG. 3b, a fine pickup tool 312 (shown as 111 in FIG. 1) with a chip 311 is delivered on this chip sitting levitation stand with its bottom face up. Once the fine pickup tool 312 is removed away, the chip 311 is then levitated as shown in FIG. 3c supported by the acoustic standing wave. As shown in FIG. 3b, a pickup tool from a chip handling head 341 (shown as 121 in FIG. 1) is moved into the chip sitting levitation stand 300 then pick up the chip without disturbing the standing wave generated by the multiple acoustic wave generator 301. The chip handling head associated component 342 may include other parts with dedicated functions, such as chip heating, if needed. Nevertheless, the associated component 342 may not be a must-have part for some direct bonding or hybrid bonding processes.

The similar design of chip sitting levitation stand 300 shown here in FIG. 3a can also be used as chip receiving head 102 in the chip supply station 100 of FIG. 1.

FIG. 4 shows a schematic embodiment of a steamline design for a proposed chip pick and place tool or chip bonder to increase its productivity. The core concept of the innovation is to steamline the chip fishing process from the tape, which is set upside-down in the chip supply stand 101 as shown in FIG. 1 by introducing multiple chip receiving heads shown as 102 in FIG. 1. As shown in FIG. 4a, the incoming chip system 400, which includes tape 401 and a set of chips 402 placed upside down on chip supply stand (no shown here but can be referred as 101 in FIG. 1). If the adhesion strength of tape used is high enough to hold the chip during the incoming pin pushing out process, which is assumed here, a full wafer or bar level UV exposure shown as 403 is carried out to weak the adhesion to prepare for incoming pin pushing process, one of mechanisms to detach chip or die as shown 103 in FIG. 1, if a UV sensitive tape, other than pressure sensitive tape, is used here. Otherwise, local UV exposure, which is not shown here for the drawing's simplicity, can be arranged by introducing side illumination from the pushing tool assemble shown as 411 in FIG. 4b. No UV exposure is needed if a pressure sensitive tape is used as the pin pushing process used as a mechanism to detach chip or die is enough to detach the die.

As shown in FIG. 4b, a pin pushing tool assemble 411, as a mechanism to detach dies or chips, is introduced on top of the targeted chip. The pushing tool assemble, as adie detachment has at least one set of pushing tool with its own pushing pin(s), which can be activated to push the target chip downwards to detach from the tape 401. The detached chip 416 is picked up by a chip receiving head shown here as 412, 413, 414, 415 (also represents the location on the conveyor belt 410), with a good synchronization between the chip pushing from pushing tool assemble 411 and chip receiving head. In other words, every detached chip 416 has a chip receiving head waiting for it while it drops. This could be relatively easy to achieve by fixing the location of the chip receiving head, e.g. the location of chip receiving head 414, while moving the whole incoming chip system 400 setting on the chip supply stand (shown as 101 in FIG. 1) laterally as shown by the arrow 417. On the other hand, all the chip receiving heads 412, 413, 414, 415, are placed on conveyor belt 410 and they move coordinately—once the chip receiving head 414 pick up its chip, it moves forward as shown in arrow 418 direction, and the chip receiving head 415 moves into the location 414. At the location indicated by 412 (also a fixed location), the chip handling head 419 picks up the chip for placement or bonding in the chip placement or bonding station shown as 120 in FIG. 1. The offloaded chip receiving head 412 can then be sent back by the conveyor belt 410 queuing after chip receiving head 415. By using such streamline design, the productivity of bonded unit (chip) per hour (UPH) can be increased to meet the volume production requirement.

The incoming chip system 400 can be a full diced wafer on a dicing tape or just chips on tape as shown above.

What is claimed is:

1. A chip bonding system comprising:
   a chip supply station, to supply a set of chips from a tape, having a mechanism to detach said set of chips;
   a set of chip receiving heads with a levitation mechanism placed on a moving conveyor belt under said chip supply station to catch and float a chip of the set of chips without touching a front bonding surface of the chip after the chip is detached;
   a chip handling station including a chip bonding head, and said moving conveyor belt configured to connect said chip supply station with the chip handling station.

2. The system of claim 1, wherein said set of chips from said tape is placed on said chip supply station with the front bonding surface of the chips from the set of chips facing down.

3. The system of claim 1, wherein said chip bonding system further comprises a surface activation station to activate the front bonding surface of said set of chips.

4. The system of claim 1, wherein said chip supply station further comprises at least a UV source to provide a UV light illumination to weaken an adhesion strength between said set of chips and said tape while a UV sensitive tape is used.

5. The system of claim 1, wherein said mechanism to detach is a pushing tool.

6. The system of claim 1, wherein said chip handling station further comprises a chip handling head configured to pick a chip floating on a chip receiving head under the chip handling station from said set of the chip receiving heads.

7. The system of claim 1, wherein said levitation mechanism is an aerodynamic levitation.

8. The system of claim 1, wherein said levitation mechanism is an electrostatic levitation after said set of chips are electrically charged through said tape.

9. The system of claim 1, wherein said levitation mechanism is an acoustic levitation.

10. The system of the claim 9, wherein said acoustic levitation is provided by an interference effect between a group of acoustic waves from a set of ultrasonic generators with a predetermined arrangement.

11. The system of the claim 9, wherein said acoustic levitation is provided by an interference effect between at least an acoustic wave from an acoustic wave generator and a reflected acoustic wave from a chip over the acoustic wave generator.

12. The system of the claim 1, wherein said chip handling station further comprises a chip sitting levitation station with a chip acoustic levitation stand configured to hold a chip of the set of chips that supply from said chip supply station.

13. The system of the claim 1, wherein said chip bonding system further comprising a chip placement and a bonding station interconnect to said chip supply station, wherein said chip supply station includes a set of chip receiving heads placed on the moving covery belt, which links said chip supply station with said chip placement and bonding station.

14. The system of the claim 1, wherein said moving conveyor belt has a fixed location under the chip supply station for a member of said set of chip receiving heads catching and floating a detached chip, then continue following the moving conveyor belt toward the chip handling station.

15. The system of the claim 1, wherein said moving conveyor belt has a fixed site in the chip handling station for a chip handling head to pick up a chip from a member of said set of chip receiving heads.

16. The system of the claim 15, wherein said member of the chip receiving heads, with said chip picked by said chip handling head, moves along the conveyor belt to return back to the chip supply station and queues for chip receiving.

17. The system of the claim 1, wherein said chip supply station has an assembly made by a set of pushing tools, which is capable of being activated individually to push and detach a chip.

18. The system of the claim 1, wherein said chip supply station is movable laterally, and even vertically, by an adjustable computer program, based on dimensions and weight of the set of chips, on a control computer of said chip bonding system.

19. The system of the claim 1, wherein said chip bonding head in said chip handling station is a chip pick and place head of a pick and place apparatus.

\* \* \* \* \*